US012633337B2

(12) United States Patent
Shamanna et al.

(10) Patent No.: US 12,633,337 B2
(45) Date of Patent: May 19, 2026

(54) SELF-RESETTING CLOCK GENERATOR

(71) Applicant: Intel Corporation, Santa Clara, CA (US)

(72) Inventors: Gururaj Shamanna, Austin, TX (US); Naveen Kumar, Bangalore (IN); Jagadeesh Chandra Salaka, Bengaluru (IN); Pascal A. Meinerzhagen, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 202 days.

(21) Appl. No.: 17/728,256

(22) Filed: Apr. 25, 2022

(65) Prior Publication Data

US 2023/0343389 A1 Oct. 26, 2023

(51) Int. Cl.

| | |
|---|---|
| *G11C 11/417* | (2006.01) |
| *G06F 1/08* | (2006.01) |
| *H03K 3/037* | (2006.01) |
| *H03K 5/00* | (2006.01) |
| *H03K 5/01* | (2006.01) |
| *H03K 19/20* | (2006.01) |
| *G06F 1/24* | (2006.01) |
| *G06F 1/28* | (2006.01) |
| *G06F 1/30* | (2006.01) |
| *G11C 7/22* | (2006.01) |
| *G11C 11/413* | (2006.01) |
| *H03K 3/355* | (2006.01) |

(52) U.S. Cl.
CPC .............. *G11C 11/417* (2013.01); *G06F 1/08* (2013.01); *H03K 5/01* (2013.01); *H03K 19/20* (2013.01); *H03K 3/037* (2013.01); *H03K 2005/00019* (2013.01)

(58) Field of Classification Search
CPC ..... G11C 11/417; G11C 7/222; G11C 11/413; G06F 1/08; G06F 1/24; G06F 1/28; G06F 1/305; H03K 5/01; H03K 19/20; H03K 3/037; H03K 2005/00019; H03K 3/355
See application file for complete search history.

(56) References Cited

U.S. PATENT DOCUMENTS

| | | | | |
|---|---|---|---|---|
| 2006/0097768 A1* | 5/2006 | Ijitsu | ........................ | H03K 5/06 327/291 |
| 2008/0080297 A1* | 4/2008 | Starnes | .................... | G11C 8/18 365/233.1 |
| 2019/0115908 A1* | 4/2019 | Prasad | ..................... | H03K 5/26 |

* cited by examiner

*Primary Examiner* — Alexander Sofocleous
*Assistant Examiner* — Joseph Fidelis Stormes
(74) *Attorney, Agent, or Firm* — Schwegman Lundberg & Woessner, P.A.

(57) ABSTRACT

An apparatus, system, and method for improved clock generator circuit operation. A self-resetting clock generator circuit includes a keeper-free clock gate configured to generate a stabilized positive clock (PCLK) signal based on an enable (ENBL) signal, a positive clock (PCLK), a reset (RST) signal, and an external clock (SOC CLK), a first bank of transistors configured to assert a clock signal (ST CLK) based on PCLK, a second bank of transistors in parallel with the first bank of transistors and configured to de-assert (1→0) ST CLK # based on PCLK assertion (0→1), and a logic gate-based reset circuit configured to generate the RST signal based on the SOC CLK and the ST CLK #.

20 Claims, 10 Drawing Sheets

700 ⟶

1000

GENERATE, BY A KEEPER-FREE CLOCK GATE, PCLK — 1010

DE-ASSERT ST CLK # BASED ON ASSERTION OF THE PCLK — 1012

ASSERT AN ST CLK BASED ON DE-ASSERTION OF THE ST CLK# — 1014

SELF-RESETTING CLOCK GENERATOR

TECHNICAL FIELD

Embodiments pertain improvements to clock generator circuits. The improvements can be realized through making the clock generator circuit self-resetting.

BACKGROUND

A modern System On Chip (SOC) can be designed for Machine Learning (ML) and Artificial Intelligence (AI) applications. Such an SOC consumes large amounts of on-chip memory for efficient processing of data. A preferred choice for on-chip memory structures are Static Random Access Memory (SRAM) and Register File (RF) arrays, due to latency and cost advantages. Since circuitry blocks within an SOC often operate at different frequencies or are otherwise not synchronized, SRAM and RF Arrays in an SOC is self-timed to maximize Power, Performance, and Area (PPA). A clock generator circuit is a common component of any self-timed SRAM/RF array. Existing clock generator topologies consume significant power when an SRAM/RF array is not accessed.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example, but not by way of limitation, various embodiments discussed in the present document.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

A clock generator circuit samples a rising transition of an SOC clock ("SOC CLK" or "external clock") and generates an internal clock signal whose high phase is independent of a high phase of the SOC clock. A high phase of the clock is when it is asserted or providing a "1" value as opposed to a "0" value. A duty cycle or high phase duration of the internal clock is determined by a delay of a tracking circuit (see FIG. 2 among others). Stated alternatively, a high phase of an internal clock is dependent on a size of the SRAM/RF array and time required to complete a read/write operation. Pre-charge of bit-lines can occur in low phase of the internal clock. State of the art clock generator circuits consume significant power even when an SRAM/RF array is not accessed.

Figures 1, 2:
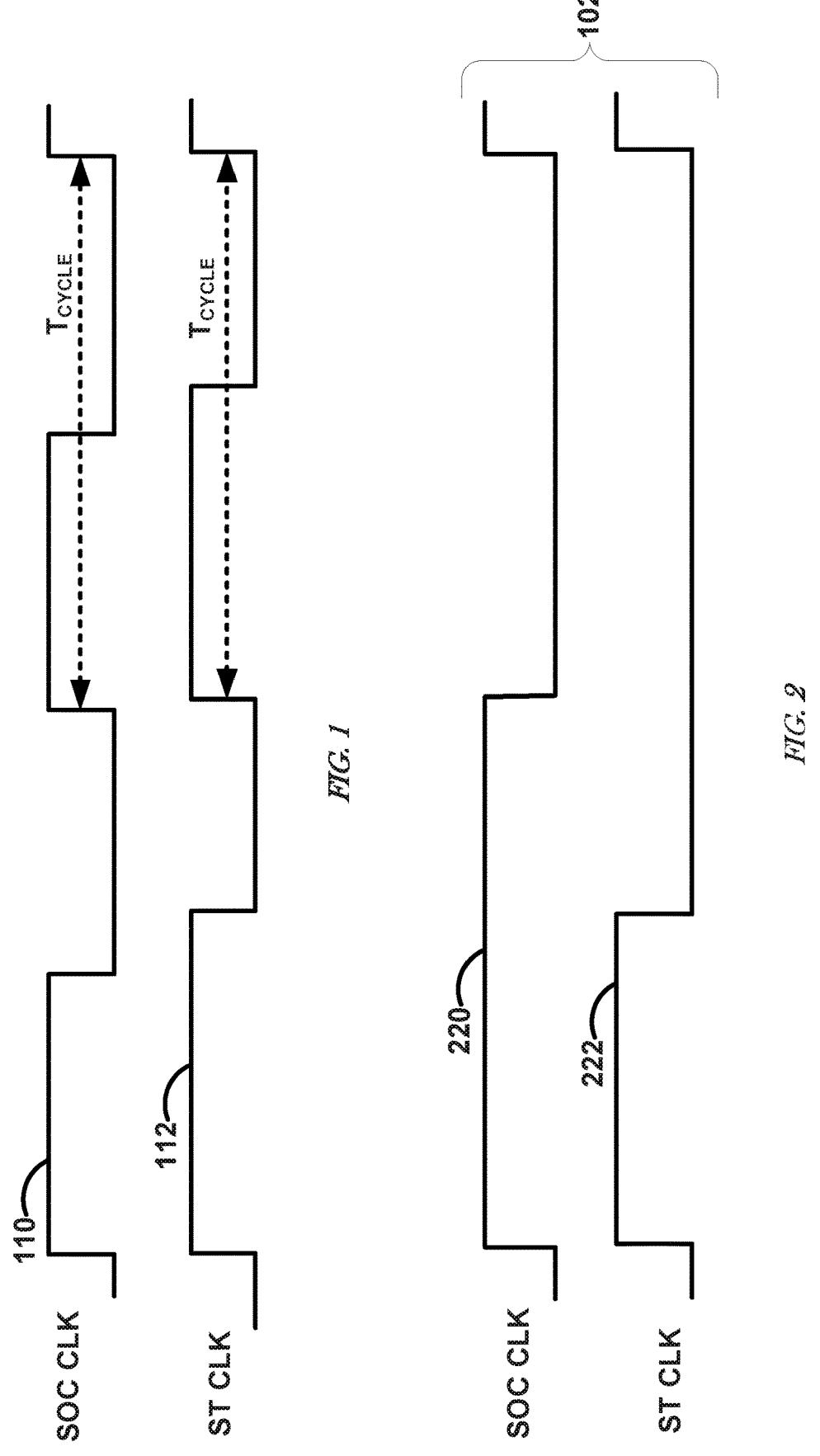
FIG. 1 illustrates, by way of example, a timing diagram of a situation in which an SOC CLK has a narrower high phase than a Self-Timed (ST) CLK, generated by a clock generator circuit internal to an SRAM Array.
FIG. 2 illustrates, by way of example, a timing diagram of a situation in which an SOC CLK has a wider high phase than an ST CLK.

FIG. 1 illustrates, by way of example, a timing diagram of a situation in which an SOC CLK has a narrower high phase than an ST CLK. The SOC CLK is represented by line 110 and the ST CLK is represented by line 112. Note that "#" means logical negation in the FIGS.

FIG. 2 illustrates, by way of example, a timing diagram of a situation in which an SOC CLK has a wider high phase than an ST CLK. The SOC CLK is represented by line 220 and the ST CLK is represented by line 222.

Figure 3:
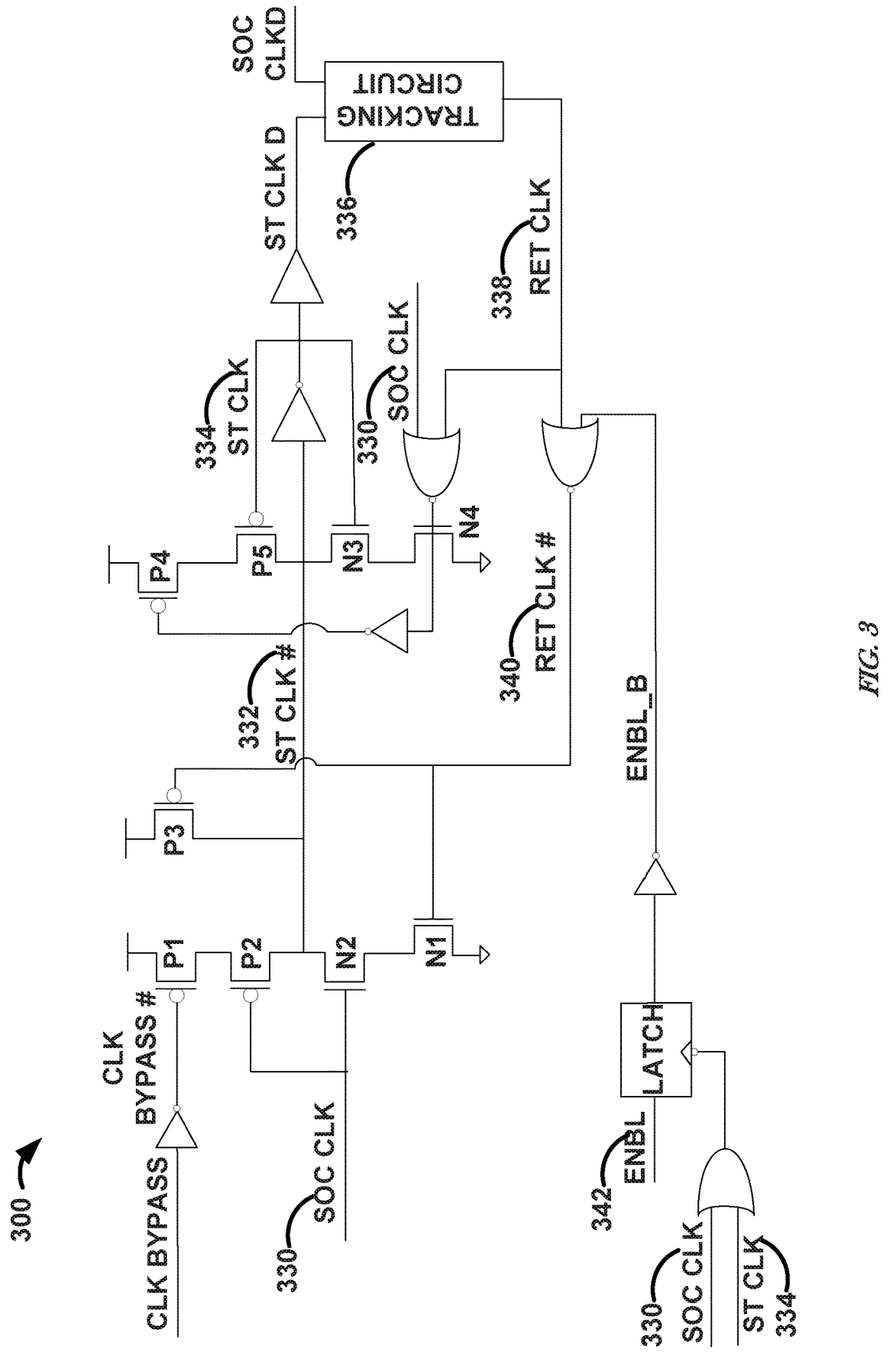
FIG. 3 illustrates, by way of example, a circuit diagram a clock generator topology (or a variant) that is currently in use.

FIG. 3 illustrates, by way of example, a circuit diagram a clock generator topology (or a variant) that is currently in use. A rising transition of SOC CLK 330 causes an ST CLK #332 node to transition low (1→0) and ST CLK 334 node to transition high (0→1). After a certain delay, dictated by delay of tracking circuit 336, RET CLK 338 rises (0→1) & RET CLK #340 transitions low (1→0); which causes transistor P3 to turn ON.

Pre-charge transistor P3 pulls ST CLK #332 high ("1") which causes the ST CLK 334 to fall (1→0) and terminate high phase of ST CLK 334. In summary, a high phase of ST CLK 334 is controlled by a delay of the tracking circuit 336 and is independent of SOC CLK 330 duty cycle. Drawbacks of the generator circuit illustrated in FIG. 3 include a high input pin capacitance of SOC CLK 330 signal and high set-up time requirement for enable (ENBL 342) signal. In addition, the circuit of FIG. 2 suffers from contention (P4/P5 vs N1/N2) for a short duration when SOC CLK 330 makes a low to high (0→1) transition and ENBL 342 is asserted ("1"). This contention results in pushout of ST CLK 334 rising (0→1) transition, which is un-desirable, since it delays rising transition of the ST CLK 334.

Figure 4:
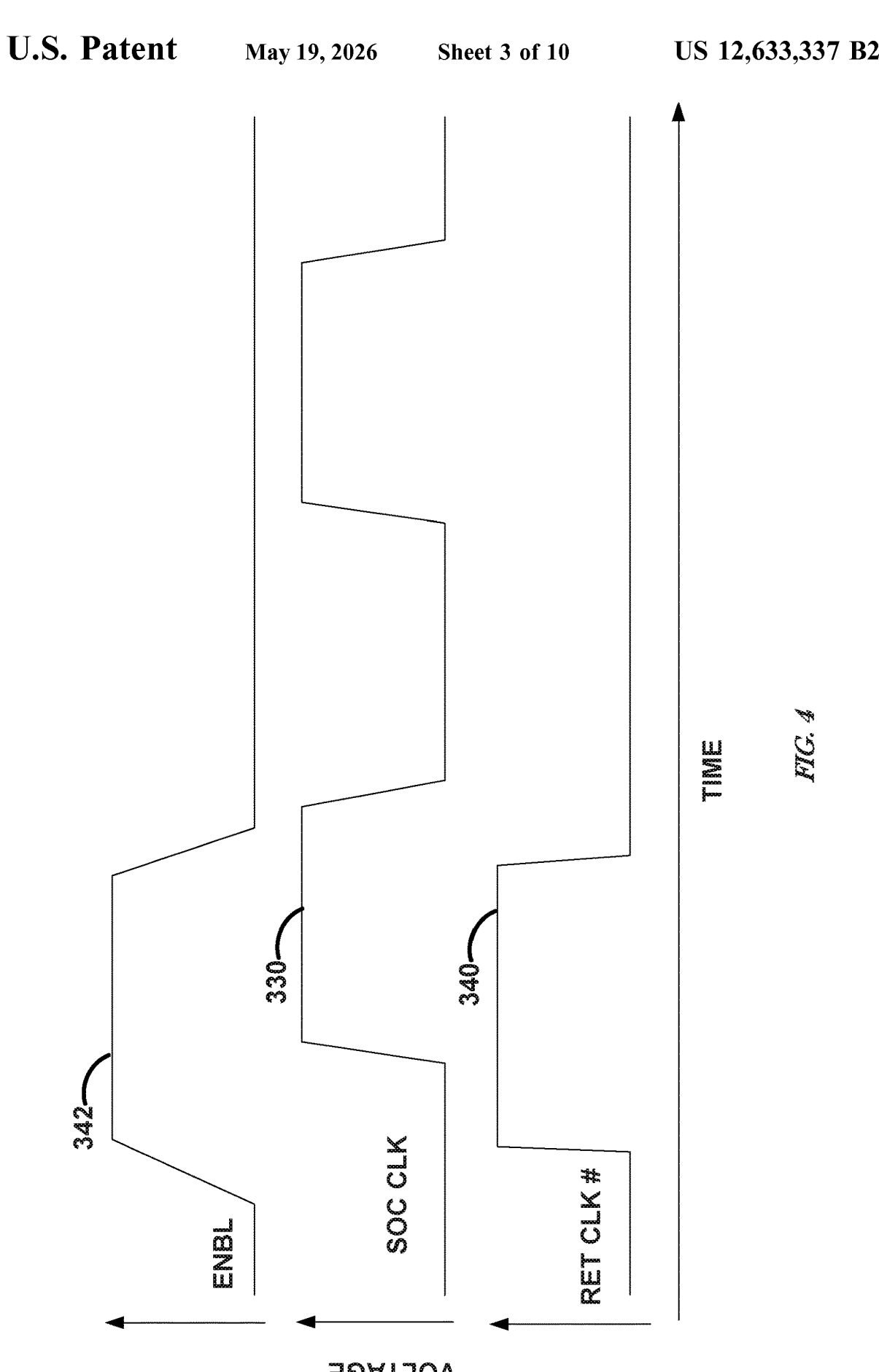
FIG. 4 illustrates, by way of example, a timing diagram of a variety of signals from the circuit illustrated in FIG. 3.

An advantage of the clock generator circuit 300 in FIG. 3 is that signals (SOC CLK 330 and RET CLK #340) controlling transistors N1 and N2 are active for sufficient duration as illustrated in FIG. 4. As a result, there are no pulse-width concerns related to evaluation of a domino of state of ST CLK #332, which implies the circuit of FIG. 3 is robust to process variations and operating voltage/temperature range.

FIG. 4 illustrates, by way of example, a timing diagram of a variety of signals from the circuit illustrated in FIG. 3. The timing diagram is for ENBL 342, SOC CLK 330, and RET CLK #340.

Figure 5:
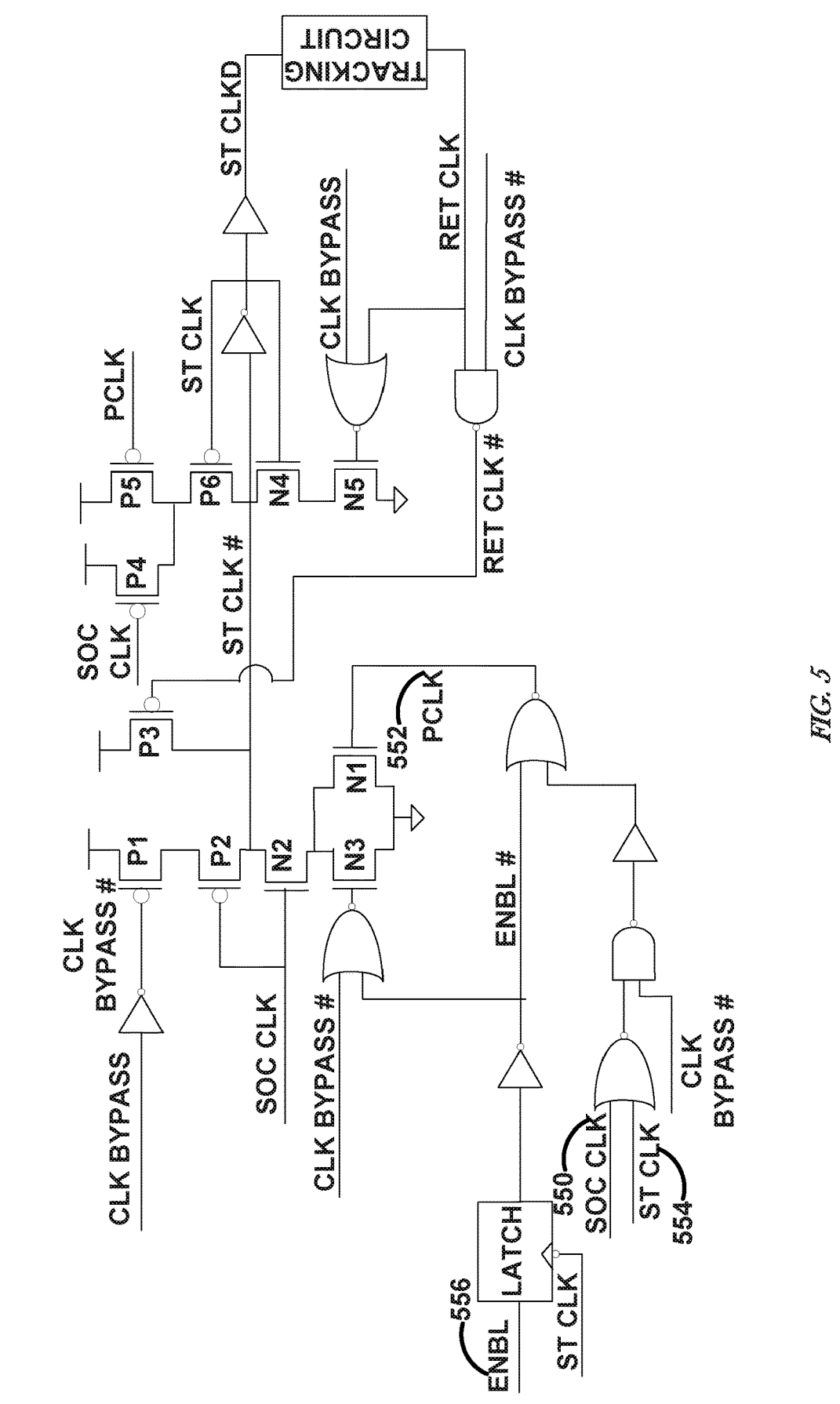
FIG. 5 illustrates, by way of example, a circuit diagram of clock generator circuit that is an alternative to the clock generator circuit of FIG. 3.

FIG. 5 illustrates, by way of example, a circuit diagram of clock generator circuit 500 that is an alternative to the clock generator circuit 300 of FIG. 3. The clock generator circuit 500, as compared to the circuit 300 is NMOS transistor N1 is enabled for a short duration in the generator circuit 500. The duration for which N1 is enabled (or turned ON) is determined by the delay (or number of stages) between SOC CLK 550 and PCLK 552.

For the circuit 500, sufficient delay (e.g., separation) must exist between SOC CLK 550 and PCLK 552 signals, to ensure ST CLK 554 transitions high ($0\rightarrow1$) before PCLK 552 transitions low ($1\rightarrow0$), across all power, voltage, temperature (PVT) corners. It can be inferred from FIG. 6, that a delay requirement between SOC CLK 550 and PCLK 552 signals to ensure proper functionality of the circuit 500, ranges from about 57 picoseconds (pS) at 0.95 V (indicated at point 664) to about 176 pS at 0.65 V (indicated at point 662).

Figure 6:
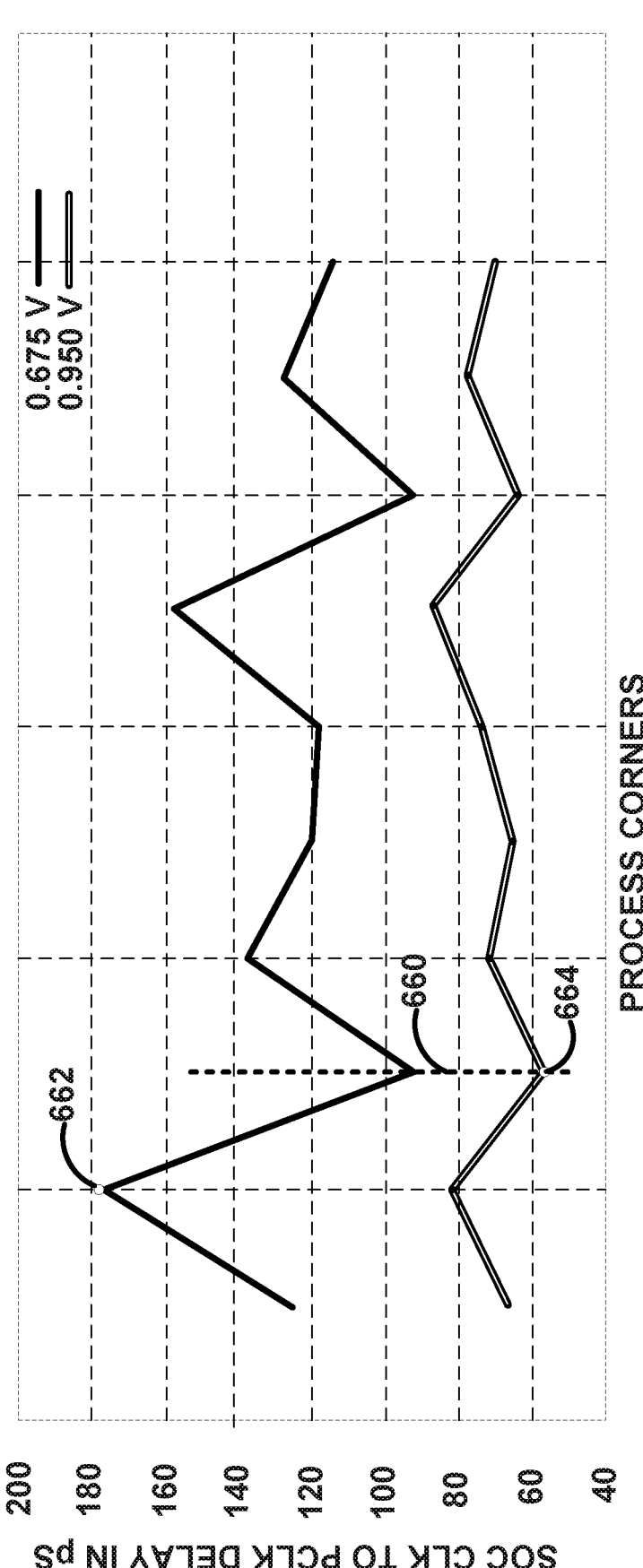
FIG. 6 illustrates, by way of example, a plot of SOC CLK to PCLK delay requirements in picoseconds for various process corners.

FIG. 6 illustrates, by way of example, a plot of SOC CLK to PCLK delay requirements in pS for various process corners. A: delay requirement is high at 0.65V/−40 degree Centigrade (corresponding to line 660) corner since impact of random variation is exacerbated due to higher threshold voltage of transistors at cold temp and slow corner. This excess delay requirement at low voltage and cold ambient condition manifests as higher set-up time requirement for ENBL 556 (see FIG. 5) and increases cell internal power at high voltage (0.95 V). Due, at least in part, to impact of random variation, inadequate delay between SOC CLK 550 and PCLK 552, will cause ST CLK 554 to transition high after PCLK 552. A plot comparing this race condition for the circuit 500 and another circuit is provided in FIG. 9. Line 990 represents the number of times the race condition is violated, that is the number of times PCLK 552 falls before ST CLK 554 rises.

In summary, the circuit 500 is more difficult to optimize for the entire PVT spectrum when compared to the circuit 300. Despite this sensitivity to PVT range, the circuit 500 is deemed attractive since it has 50% lower clock pin cap (or load) when compared to the circuit 300. Lower clock pin cap is preferred when designing large memory systems (like Level-2/3 caches), since only a handful of memory instances are activated (enabled) during a read/write operation.

The circuit 300 has high setup time for ENBL 342, high pin cap for SOC CLK 330 signal and there is a small window of contention when SOC CLK 330 makes a $0\rightarrow1$ transition when ENBL 342 is high. The circuit 300 is difficult to optimize set-up time ENBL 556 across PVT spectrum but has lower pin cap (pin capacitance) for SOC CLK 550. Both the circuits 300 and 500 consume significant internal power when a memory is idle or not accessed. The circuit 500 is sensitive to process drifts or NP ratio re-targeting due to delay chain existing in PCLK 552 path. Consequently, the circuit 500 is more prone to failures.

Embodiments provide a clock generator topology that consumes ~10× lower power than the circuits 300 and 500 when memory is idle or not accessed. Embodiments provide a clock generator circuit that overcomes the other drawbacks of the circuits 300 and 500. The clock generator circuit of embodiments uses a feedback mechanism to terminate the internally generated clock pulse thereby making the circuit less sensitive to process variations and PVT corners. The clock generator circuit of embodiments has a lower setup time than the clock generator circuits 300 and 500.

Figure 7:
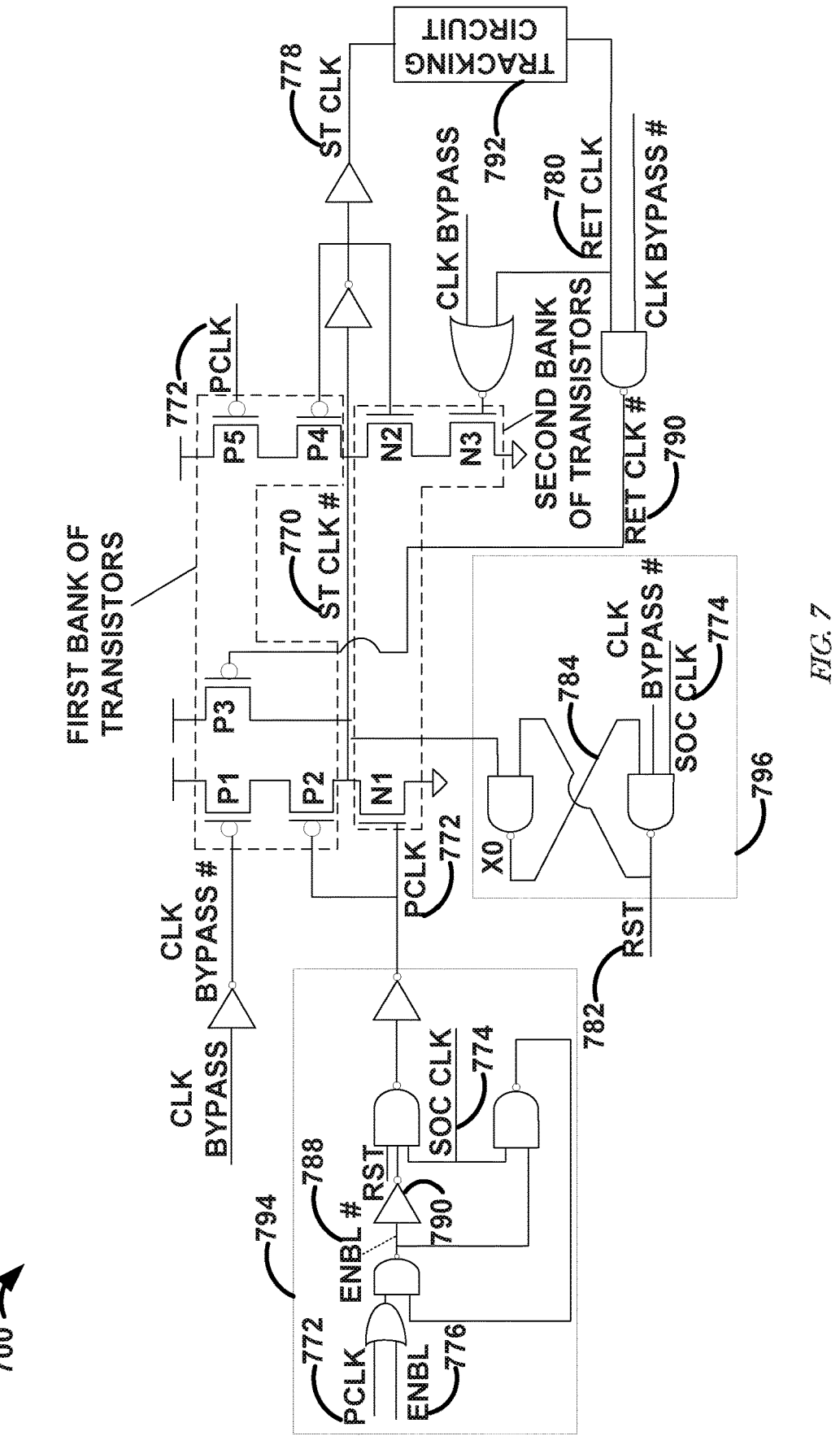
FIG. 7 illustrates, by way of example, a circuit diagram of an embodiment of a clock generator circuit.

FIG. 7 illustrates, by way of example, a circuit diagram 700 of an embodiment of a clock generator circuit 700. The clock generator circuit 700 does not suffer from the drawback of the circuits 300 and 500. The clock generator circuit 700 is self-resetting. Self-resetting means the transition of output ST CLK #770 is used to terminate (or de-assert) input PCLK 772. Consequently, dis-charge of ST CLK #770 is guaranteed across all PVT corners, since PCLK 772 terminates if and only if ST CLK #770 discharges.

The circuit 700 includes a keeper-free clock gate 794 and a NAND gate-based reset circuit 796. The keeper-free clock gate 794 receives PCLK 772 and ENBL 776 and provides a PCLK 772 signal as output. ST CLK #770 is de-asserted by transistor N1 when PCLK is asserted. Transistors P5, P4, N2, N3 function as a keeper structure and maintain value of STCLK # when PCLK or RETCLK is de-asserted. The tracking circuit 792 provides the RET CLK 780 in a manner that meets high phase and low phase timing constraints of ST CLK 778.

The reset circuit 796 includes two NAND gates (or equivalent logic). The reset circuit 796 includes a first NAND gate that receives ST CLK #770 and RST 782 as input and produces X0 784 as output. A second NAND gate receives X0 784, a bypass signal, and the SOC CLK 774, and produces the RST 782. When RST 782 is asserted, ENBL 776 is asserted, and SOC CLK 774 is asserted, PCLK 772 is also asserted by the keeper-free clock gate 794. The circuit 700 includes a pull up bank of transistors (P1, P2, P3, P4, P5) and pull down bank of transistors (N1, N2, N3) that ultimately control the value of ST CLK 778.

In a quiescent (inactive/idle) state, components of the clock generator circuit 700 can be pre-conditioned as follows: SOC CLK 774 is de-asserted (logic 0), ENBL 776 is de-asserted (logic 0), ST CLK 778 is de-asserted, PCLK 772 is de-asserted (logic 0), RET CLK 780 is de-asserted, ST CLK #770 is asserted (logic 1), RST 782 is asserted (logic 1), and X0 784 is asserted (logic 1). In the inactive state (STCLK is logic 0) domino state node, ST CLK #770 is held high by pull up transistors P4 and P5. When ENBL 776 is asserted, ENBL #788 is de-asserted and a corresponding asserted output is provided by inverter 790. A rising transition of SOC CLK 774 triggers PCLK 772 to become asserted ($0\rightarrow1$) and ST CLK #770 to become de-asserted (transition from logic 1 to logic 0). The de-assertion of ST CLK #770 triggers ST CLK 778 to become asserted (transition from 0 to 1), X0 784 to become asserted, RST 782 to become de-asserted ($1\rightarrow0$), and PCLK 772 to become de-asserted. At this point ST CLK #770 is held low ("0") by transistors N2 and N3. The falling transition of SOC CLK 774 has no impact on PCLK 772 in this state since PCLK 772 stays low.

After a certain delay ($\Delta T1$) determined by tracker circuit 792, RET CLK 780 transitions to become asserted. This assertion of RET CLK 780 triggers RET CLK #790 to become de-asserted ($1\rightarrow0$ transition). De-assertion of RET CLK #790 activates transistor P3 and de-activates transistor N3. Consequently, ST CLK #770 transitions being asserted ($0\rightarrow1$) and ST CLK 778 transitions to being de-asserted ($1\rightarrow0$). After a certain delay ($\Delta T2$) determined by tracker circuit 792, RET CLK 780 becomes de-asserted ($1\rightarrow0$). The de-assertion of RET CLK 780 causes RET CLK # to become asserted. The assertion of RET CLK #790 shuts off transistor P3 causing P4 and P5 to hold ST CLK #770 in an asserted state. The clock generator circuit 700 in this state is then ready for a next memory operation (read or write). In summary, RET CLK 780 transitions twice during a single memory read (or write) operation. The first is an assertion transition that determines a high phase of self-timed clk (ST CLK 778) and a second de-assertion transition of RET CLK 780 determines a low phase of ST CLK 778.

Figure 8:
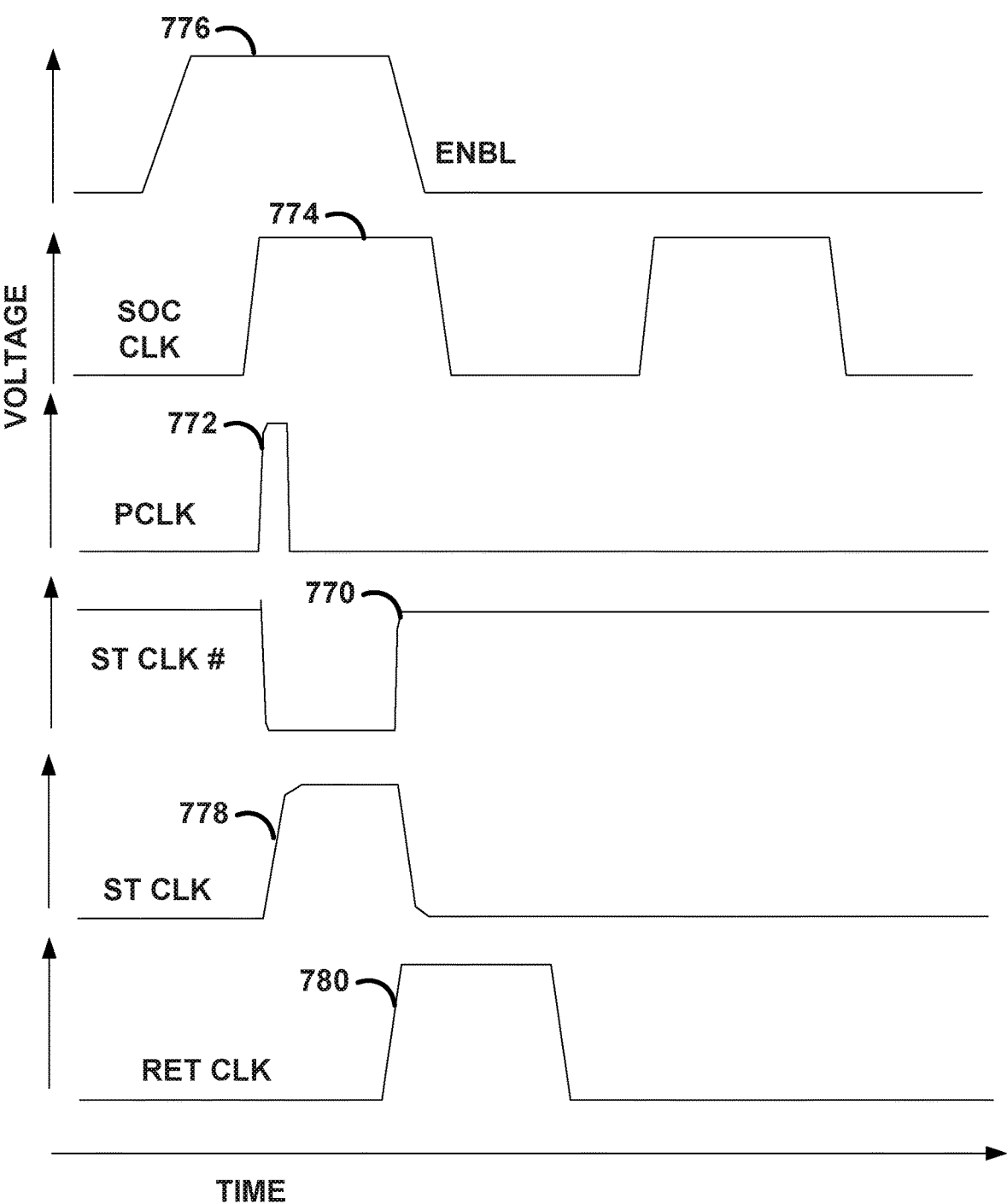
FIG. 8 illustrates, by way of example, a voltage versus time plot of a variety of components of the circuit described in FIG. 7.

FIG. 8 illustrates, by way of example, a voltage versus time plot of a variety of components of the circuit 700. The plot of FIG. 8 shows a timespan of a single memory read or write operation using the clock generator circuit 700. A read or write operation begins with asserting ENBL 776. The subsequent assertion of the SOC CLK 774 causes PCLK 772 to become asserted. PCLK 772 being asserted causes ST CLK #770 to become de-asserted and ST CLK 778 to become asserted. De-assertion of ST CLK #770 causes PCLK 772 to become de-asserted after a configurable gate delay. The tracking circuit 792, after a configurable delay, de-asserts the RET CLK 780.

Figure 9:
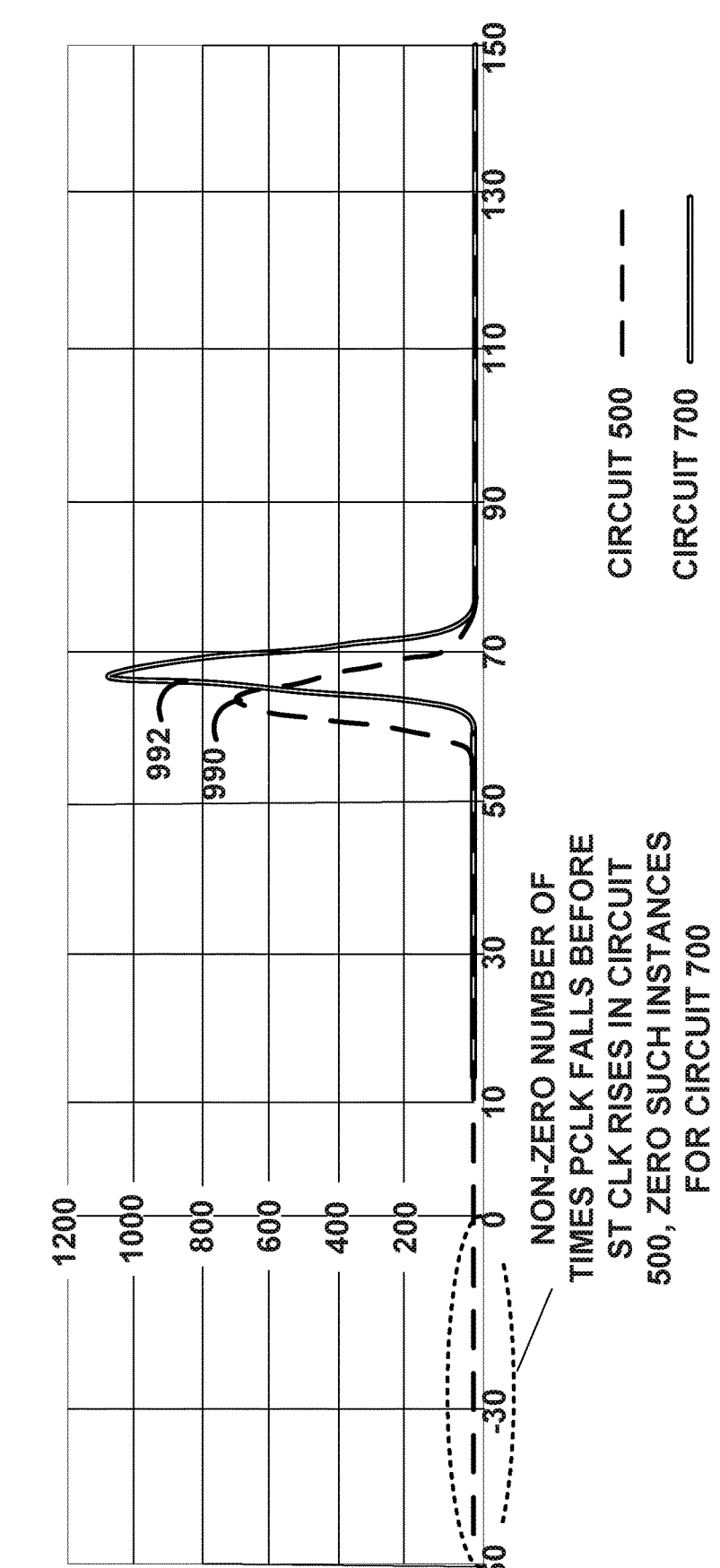
FIG. 9 illustrates, by way of example, a regression curve representation of time between ST CLK rising and PCLK falling.

FIG. 9 illustrates, by way of example, a regression curve representation of time between ST CLK rising and PCLK falling. A negative time between ST CLK rising and PCLK falling is considered a fault (failing scenario) condition. A line 990 represents the time between ST CLK rising and PCLK falling in the circuit 500 and another line 992 represents the time between ST CLK rising PCLK falling in the circuit 700. As can be seen, there is a non-zero number of times PCLK falls before ST CLK rises in the circuit 500 and there are no times that the circuit 700 has such a fault. The self-resetting clock generator circuit 700 has a positive race margin when compared to the circuit 500, even in the presence of variation. For a similar median delay (~60-65 pS), race margin between ST CLK and PCLK signals always remains positive.

Figure 10:
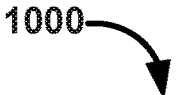
FIG. 10 illustrates, by way of example, a block diagram of an embodiment of a method for self-generating clock generator circuit operation.
Figure 10:
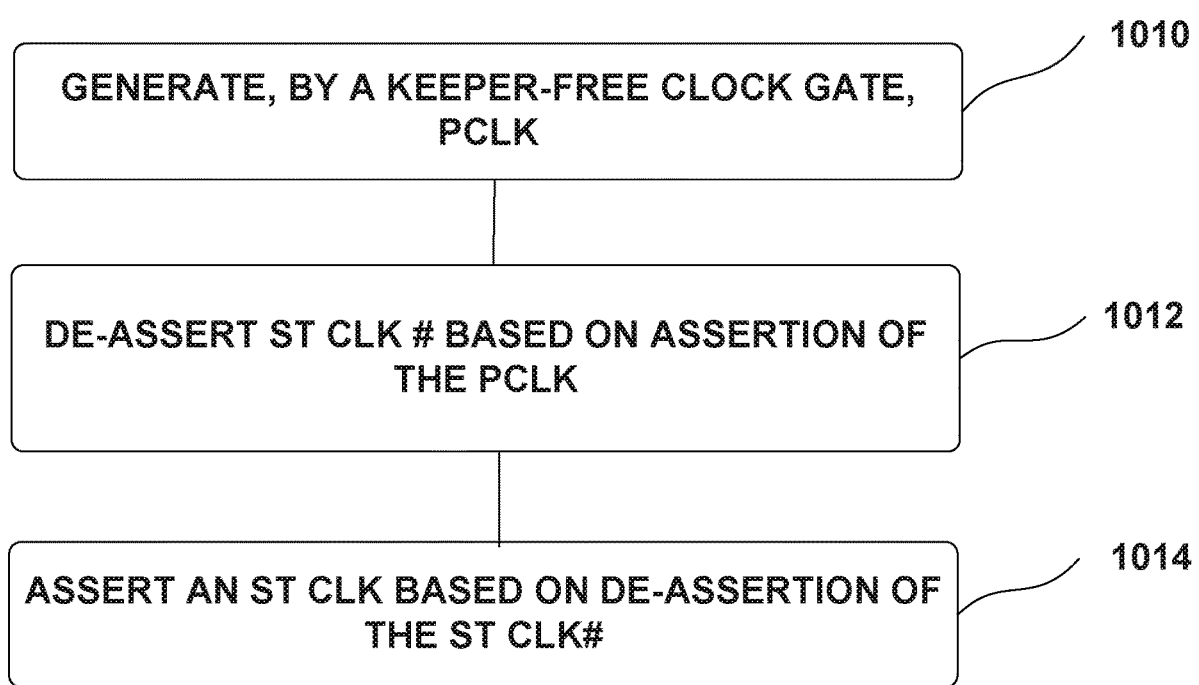

FIG. 10 illustrates, by way of example, a block diagram of an embodiment of a method 1000 for self-generating clock generator circuit 700 operation. The method 1000 as illustrated includes generating (e.g., by a keeper-free clock gate) a positive clock (PCLK) signal (e.g., based on an enable (ENBL) signal, a reset (RST) signal, the PCLK fed back as input, and an external clock (SOC CLK)), at operation 1010; de-asserting a self-timed clock signal (ST CLK #) based on assertion of PCLK, at operation 1012; and asserting ST CLK based on de-assertion of the STCLK #, at operation 1014.

The method 1000 can include generating, by a logic gate-based reset circuit, the RST signal based on the SOC CLK and the ST CLK #. The method 1000 can include controlling, by a tracking circuit, a state of a return clock (RET CLK) signal coupled to the first bank of transistors, assertion of the RET CLK signal causing the ST CLK # signal to change state. The method 1000 can include, wherein the self-resetting clock generator circuit is configured such that a (1→0) transition of ST CLK # de-asserts PCLK. The first bank of transistors can include a plurality of drain connected transistors with gates controlled by PCLK. The second bank of transistors can include a second plurality of drain connected transistors with a gate of one of the transistors of the second plurality of transistors controlled by PCLK.

Figure 11:
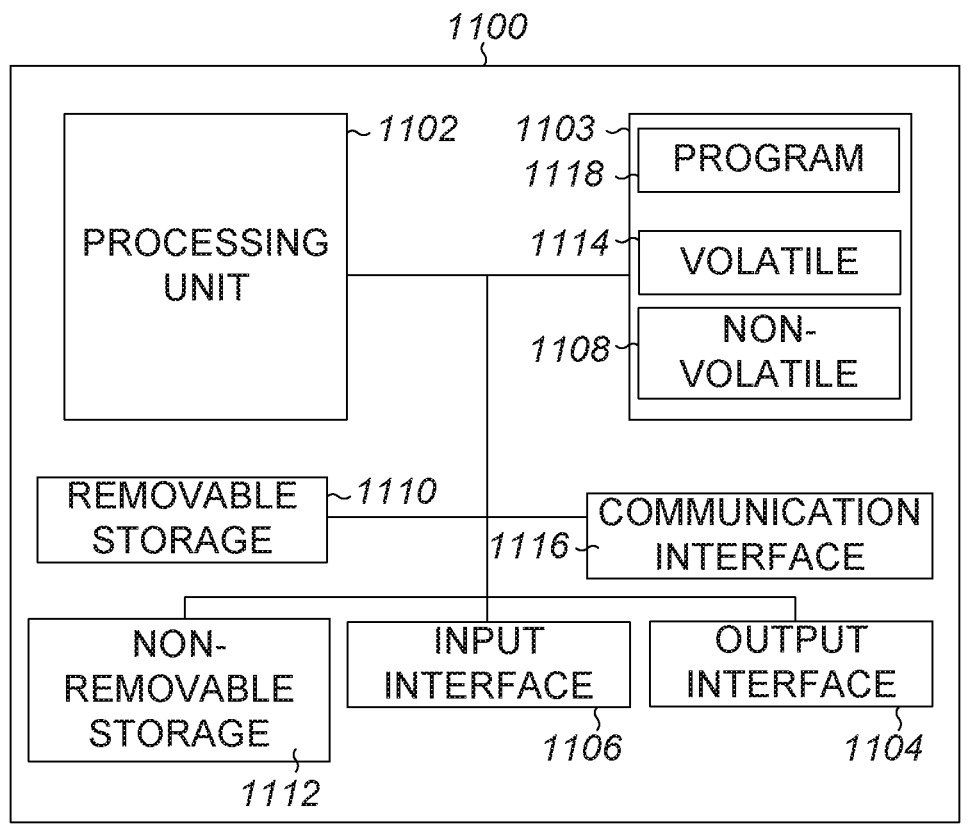
FIG. 11 illustrates, by way of example, a block diagram of an embodiment of a machine (e.g., a computer system) in which the improved self-resetting clock generator circuit of FIG. 7, or another device discussed herein can be used.

FIG. 11 illustrates, by way of example, a block diagram of an embodiment of a machine 1100 (e.g., a computer system) in which the improved self-resetting clock generator circuit of FIG. 7, or another device discussed herein can be used. One example machine 1100 (in the form of a computer), may include a processing unit 1102, memory 1103, removable storage 1110, and non-removable storage 1112. Although the example computing device is illustrated and described as machine 1100, the computing device may be in different forms in different embodiments. Further, although the various data storage elements are illustrated as part of the machine 1100, the storage may also or alternatively include cloud-based storage accessible via a network, such as the Internet.

Memory 1103 may include volatile memory 1114 and non-volatile memory 1108. The machine 1100 may include—or have access to a computing environment that includes—a variety of computer-readable media, such as volatile memory 1114 and non-volatile memory 1108, removable storage 1110 and non-removable storage 1112. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices capable of storing computer-readable instructions for execution to perform functions described herein.

The machine 1100 may include or have access to a computing environment that includes input 1106, output 1104, and a communication connection 1116. Output 1104 may include a display device, such as a touchscreen, that also may serve as an input device. The input 1106 may include one or more of a touchscreen, touchpad, mouse, keyboard, camera, one or more device-specific buttons, one or more sensors integrated within or coupled via wired or wireless data connections to the machine 1100, and other input devices. The computer may operate in a networked environment using a communication connection to connect to one or more remote computers, such as database servers, including cloud-based servers and storage. The remote computer may include a personal computer (PC), server, router, network PC, a peer device or other common network node, or the like. The communication connection may include a Local Area Network (LAN), a Wide Area Network (WAN), cellular, Institute of Electrical and Electronics Engineers (IEEE) 802.11 (Wi-Fi), Bluetooth, or other networks.

Computer-readable instructions stored on a computer-readable storage device are executable by the processing unit 1102 (sometimes called processing circuitry) of the machine 1100. A hard drive, CD-ROM, and RAM are some examples of articles including a non-transitory computer-readable medium such as a storage device. For example, a computer program 1118 may be used to cause processing unit 1102 to perform one or more methods or algorithms described herein.

Note that the term "circuitry" or "circuit" as used herein refers to, is part of, or includes hardware components, such as transistors, resistors, capacitors, diodes, inductors, amplifiers, oscillators, switches, multiplexers, logic gates (e.g., AND, OR, X0R), power supplies, memories, or the like, such as can be configured in an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" or "circuit" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry" or "processor" as used herein thus refers to, is part of, or includes circuitry capable of sequentially and automatically carrying out a sequence of arithmetic or logical operations, or recording, storing, and/or transferring digital data. The term "processor circuitry" or "processor" may refer to one or more application processors, one or more baseband processors, a physical central processing unit (CPU), a single- or multi-core processor, and/or any other device capable of executing or otherwise operating computer-executable instructions, such as program code, software modules, and/or functional processes.

ADDITIONAL NOTES AND EXAMPLES

Example 1 includes a self-resetting clock generator circuit comprising a keeper-free clock gate configured to generate a positive clock (PCLK) signal based on an enable (ENBL) signal, the PCLK fed back as input, a reset (RST) signal, and an external clock (SOC CLK), a first bank of transistors configured to assert a clock signal (ST CLK #) a second bank of transistors in parallel with the first bank of transistors and configured to de-assert (1→0) ST CLK # based on PCLK assertion (0→1), and a logic gate-based reset circuit configured to generate the RST signal based on the SOC CLK and the ST CLK In Example 2, Example 1 includes a tracking circuit configured to control a state of a return clock (RET CLK) signal coupled to the first bank of transistors, assertion of the RET CLK signal causing the ST CLK # signal to change state.

In Example 3, at least one of Examples 1-2 includes, wherein the circuit is configured such that a (1→0) transition of ST CLK # de-asserts PCLK.

In Example 4, Example 3 further includes, wherein the transition of ST CLK # de-asserts PCLK after a configurable delay.

In Example 5, at least one of Examples 1-4 further includes, wherein the logic gate based reset circuit includes a first gate configured to receive the ST CLK # signal and the RST signal and generate an intermediate signal (X0), and a second gate configured to receive the X0 signal and the SOC CLK and generate the RST signal.

In Example 6, at least one of Examples 1-5 further includes, wherein the first bank of transistors includes a plurality of drain connected transistors with gates controlled by PCLK.

In Example 7, at least one of Examples 5-6 further includes, wherein the second bank of transistors includes a second plurality of drain connected transistors with a gate of one of the transistors of the second plurality of transistors controlled by PCLK and a gate of other transistors of the second plurality of transistors controlled by ST CLK.

Example 8 includes a system comprising a memory device including a self-resetting clock generator circuit, the self-resetting clock generator circuit comprising a keeper-free clock gate configured to generate a positive clock (PCLK) signal based on an enable (ENBL) signal, a reset (RST) signal, and an external clock (SOC CLK), a first bank of transistors configured to assert a self-timed clock signal (ST CLK #) and a second bank of transistors in parallel with the first bank of transistors and configured to de-assert (1→0) ST CLK # based on PCLK assertion (0→1).

In Example 9, Example 8 further includes, wherein the self-resetting clock generator includes a logic gate-based reset circuit configured to generate the RST signal based on the SOC CLK and the ST CLK #.

In Example 10, at least one of Examples 8-9, further includes a tracking circuit configured to control a state of a return clock (RET CLK) signal coupled to the first bank of transistors, assertion of the RET CLK signal causing the ST CLK # signal to change state.

In Example 11, at least one of Examples 8-10 further includes, wherein the circuit is configured such that a (1→0) transition of ST CLK # de-asserts PCLK.

In Example 12, Example 11 further includes, wherein the transition of ST CLK # de-asserts PCLK after a configurable delay.

In Example 13, at least one of Examples 8-12 further includes, wherein the logic gate based reset circuit includes a first gate configured to receive the ST CLK # signal and the RST signal and generate an intermediate signal (X0), and a second gate configured to receive the X0 signal and the SOC CLK and generate the RST signal.

In Example 14 at least one of Examples 8-13 further includes, wherein the first bank of transistors includes a plurality of drain connected transistors with gates controlled by PCLK.

In Example 15, Example 14 further includes, wherein the second bank of transistors includes a second plurality of drain connected transistors with a gate of one of the transistors of the second plurality of transistors controlled by PCLK.

Example 16 includes a method for generating a clock signal for a memory, the method comprising generating, by a keeper-free clock gate, a positive clock (PCLK) signal based on an enable (ENBL) signal, a reset (RST) signal, the PCLK fed back as input, and an external clock (SOC CLK), de-asserting ST CLK # based on assertion of the PCLK, and asserting an ST CLK based on de-assertion of the ST CLK #.

In Example 17, Example 16 further includes generating, by a logic gate-based reset circuit, the RST signal based on the SOC CLK and the ST CLK #.

In Example 18, at least one of Examples 16-17 further includes controlling, by a tracking circuit, a state of a return clock (RET CLK) signal coupled to the first bank of transistors, assertion of the RET CLK signal causing the ST CLK # signal to change state.

In Example 19, at least one of Examples 16-18 further includes, wherein the self-resetting clock generator circuit is configured such that a (1→0) transition of ST CLK # de-asserts PCLK.

In Example 20, at least one of Examples 18-19 further includes, wherein the transition of ST CLK # de-asserts PCLK after a configurable delay.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

The subject matter may be referred to herein, individually and/or collectively, by the term "embodiment" merely for convenience and without intending to voluntarily limit the scope of this application to any single inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, UE, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A self-resetting clock generator circuit comprising:
a keeper-free clock gate configured to generate a positive clock (PCLK) signal based on an enable (ENBL) signal, the PCLK fed back as input, a reset (RST) signal, and an external clock (SOC CLK);
a first bank of transistors configured to assert a clock signal (ST CLK) based on PCLK and a negated return clock (RETCLK #);
a second bank of transistors in parallel with the first bank of transistors and configured to de-assert (1→0) self-timed clock signal (ST CLK #) based on PCLK assertion (0→1);
a logic gate-based reset circuit configured to generate the RST signal based on the SOC CLK and the ST CLK #.

2. The circuit of claim 1, further comprising a tracking circuit configured to control a state of a return clock (RET CLK) signal coupled to the first bank of transistors, assertion of the RET CLK signal causing the ST CLK # signal to change state.

3. The circuit of claim 1, wherein the circuit is configured such that a (1→0) transition of ST CLK # de-asserts PCLK.

4. The circuit of claim 3, wherein the transition of ST CLK # de-asserts PCLK after a configurable delay.

5. The circuit of claim 1, wherein the logic gate based reset circuit includes:
a first gate configured to receive the ST CLK # signal and the RST signal and generate an intermediate signal (X0); and
a second gate configured to receive the X0 signal and the SOC CLK and generate the RST signal.

6. The circuit of claim 1, wherein the first bank of transistors includes a plurality of drain connected transistors with gates controlled by PCLK.

7. The circuit of claim 5, wherein the second bank of transistors includes a second plurality of drain connected transistors with a gate of one of the transistors of the second plurality of transistors controlled by PCLK.

8. A system comprising:
a memory device including a self-resetting clock generator circuit, the self-resetting clock generator circuit comprising:
a keeper-free clock gate configured to generate a positive clock (PCLK) signal based on an enable (ENBL) signal, a reset (RST) signal, and an external clock (SOC CLK);
a first bank of transistors configured to assert a self-timed clock signal (ST CLK #); and
a second bank of transistors in parallel with the first bank of transistors and configured to de-assert (1→0) ST CLK # based on PCLK assertion (0→1).

9. The system of claim 8, wherein the self-resetting clock generator includes a logic gate-based reset circuit configured to generate the RST signal based on the SOC CLK and the ST CLK #.

10. The system of claim 8, further comprising a tracking circuit configured to control a state of a return clock (RET CLK) signal coupled to the first bank of transistors, assertion of the RET CLK signal causing the ST CLK # signal to change state.

11. The system of claim 8, wherein the circuit is configured such that a (1→0) transition of ST CLK # de-asserts PCLK.

12. The system of claim 11, wherein the transition of ST CLK # de-asserts PCLK after a configurable delay.

13. The system of claim 8, wherein the logic gate based reset circuit includes:
a first gate configured to receive the ST CLK # signal and the RST signal and generate an intermediate signal (X0); and
a second gate configured to receive the X0 signal and the SOC CLK and generate the RST signal.

14. The system of claim 8, wherein the first bank of transistors includes a plurality of drain connected transistors with gates controlled by PCLK.

15. The system of claim 14, wherein the second bank of transistors includes a second plurality of drain connected transistors with a gate of one of the transistors of the second plurality of transistors controlled by PCLK.

16. A method for generating a clock signal for a memory, the method comprising:

generating, by a keeper-free clock gate, a positive clock (PCLK) signal based on an enable (ENBL) signal, a reset (RST) signal, the PCLK fed back as input, and an external clock (SOC CLK);

de-asserting self-timed clock signal (ST CLK #) based on assertion of the PCLK; and asserting an self-timed clock signal (ST CLK) based on de-assertion of the ST CLK #.

17. The method of claim 16, further comprising generating, by a logic gate-based reset circuit, the RST signal based on the SOC CLK and the ST CLK #.

18. The method of claim 16, further comprising controlling, by a tracking circuit, a state of a return clock (RET CLK) signal coupled to a first bank of transistors, assertion of the RET CLK signal causing the ST CLK # signal to change state.

19. The method of claim 16, wherein the self-resetting clock generator circuit is configured such that a (1→0) transition of ST CLK # de-asserts PCLK.

20. The method of claim 18, wherein the transition of ST CLK # de-asserts PCLK after a configurable delay.

* * * * *